(12) United States Patent
Deepak et al.

(10) Patent No.: US 7,197,445 B1
(45) Date of Patent: Mar. 27, 2007

(54) ATOMIC TRANSACTION PROCESSING FOR LOGIC SIMULATION

(75) Inventors: Kumar Deepak, San Jose, CA (US); Jimmy Zhenming Wang, Saratoga, CA (US); Wei Lin, Santa Clara, CA (US)

(73) Assignee: Xilinx, Inc., San Jose, CA (US)

( * ) Notice: Subject to any disclaimer, the term of this patent is extended or adjusted under 35 U.S.C. 154(b) by 669 days.

(21) Appl. No.: 10/389,126

(22) Filed: Mar. 14, 2003

(51) Int. Cl.
| | |
|---|---|
| G06F 17/50 | (2006.01) |
| G06F 17/00 | (2006.01) |
| G06F 9/46 | (2006.01) |
| G06F 9/06 | (2006.01) |
| G06F 9/00 | (2006.01) |

(52) U.S. Cl. .................... 703/14; 703/16; 703/19; 703/22; 718/105; 718/101

(58) Field of Classification Search .............. 703/16, 703/19
See application file for complete search history.

(56) References Cited

U.S. PATENT DOCUMENTS

| | | | | |
|---|---|---|---|---|
| 5,157,620 | A * | 10/1992 | Shaar .......................... 703/16 |
| 6,097,885 | A * | 8/2000 | Rayner ........................ 703/17 |
| 6,934,719 | B2 * | 8/2005 | Nally et al. .............. 707/104.1 |
| 6,961,689 | B1 * | 11/2005 | Greenberg .................... 703/17 |
| 7,062,768 | B2 * | 6/2006 | Kubo et al. .................. 718/105 |
| 2003/0191615 | A1 * | 10/2003 | Bailey et al. ................. 703/13 |
| 2003/0191869 | A1 * | 10/2003 | Williams et al. ............ 709/328 |

OTHER PUBLICATIONS

Shivers et al. "Atomic Heap Transactions and Fine-grain Interrupts", ACM 1999, pp. 48-59.*

* cited by examiner

Primary Examiner—Kamini Shah
Assistant Examiner—Suzanne Lo
(74) Attorney, Agent, or Firm—Kevin Cuenot (57) ABSTRACT

A method (900) of modeling transactions and performing inertial rejection can include representing a plurality of scalar signals as one or more transaction objects, wherein each transaction object comprises a start index, an end index, values for each constituent scalar signal which correspond to an index within a range specified by the start index and end index inclusive, and a time at which the values are transacted. (400) The method further can include constructing and adding a new transaction object for the plurality of scalar signals (920) and comparing the new transaction object with at least one existing transaction object (925) wherein the at least one existing transaction object occurs earlier in time than the new transaction object and is within a rejection window. At least one of a start index and an end index of the at least one existing transaction object can be manipulated (975).

26 Claims, 6 Drawing Sheets

ATOMIC TRANSACTION PROCESSING FOR LOGIC SIMULATION

BACKGROUND OF THE INVENTION

1. Technical Field

The present invention relates to the field of logic simulation and, more particularly, to simulating and processing signals within logic simulators.

2. Description of the Related Art

A logic simulator is a software tool which is capable of performing functional and timing simulations for digital electronic designs which are written in a hardware description language such as Very High Speed Hardware Description Language (VHDL) or Verilog. VHDL, for example, permits hardware designers to define signals at a very high level of abstraction. The abstracted signal representations can be translated to actual pins on a microchip using any of a variety of commercial electronic design automation (EDA) software tools.

VHDL provides a measure of flexibility by allowing hardware designers to declare signals of various user defined types. A user-defined type can either be a scalar or a composite type. Scalars further can be subdivided into four different types, namely enumeration, integer, floating point, and physical. Composites, however, can be subdivided into two types: arrays and records.

A scalar type defines a single value for a signal and a composite type defines a collection of values. New values can be assigned to signals through signal assignment statements. A signal assignment statement defines a container for a new projected output waveform for the signal. Such a container is referred to as the driver of the target signal. A pair which includes a new value and the time at which the signal is to assume this new value is called a transaction. For a scalar target signal there can be only one driver and one waveform. For a composite target signal, however, the composite signal is thought of as an aggregation of multiple scalar signals. A composite signal can include N drivers and N waveforms, where one waveform is attached to each driver and where N is total number of scalar signals contained in the given composite signal. The projected waveform of a scalar driver has transactions that occur as the time component increases.

Transactions can be scheduled using one of two different techniques. The first technique, called transport scheduling, truncates any previous transaction whose time component is greater than the time component of the new transaction being scheduled. The second technique, referred to as inertial scheduling, takes a rejection limit and goes further than the truncation technique. More particularly, after truncating transactions whose time component is greater than the new transaction being scheduled, inertial rejection rejects all transactions in the rejection limit window except for transactions which immediately precede the new transaction and whose value component is the same as the new transaction being scheduled. The transaction that determines the current value of the driver is excluded from rejection as well.

Figure 1:
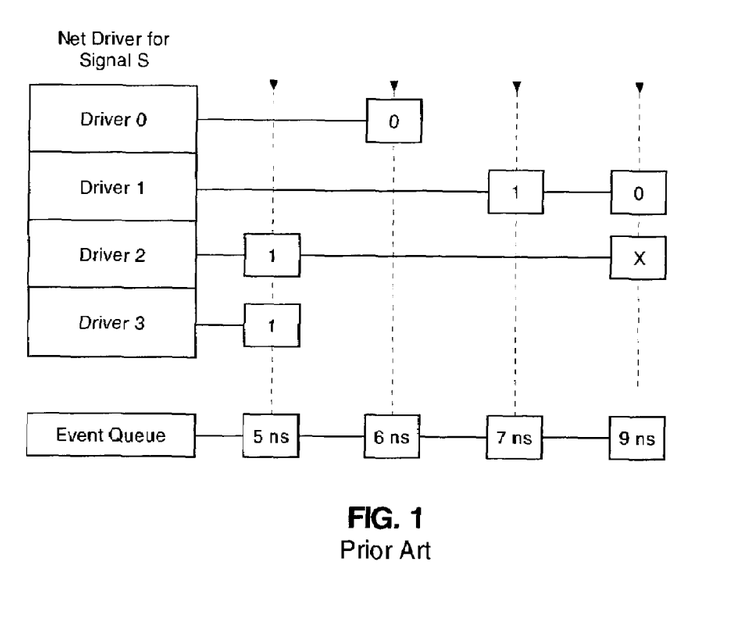
FIG. 1 is a schematic diagram illustrating a conventional manner of illustrating waveform transactions.

FIG. 1 is a schematic diagram illustrating a conventional manner of illustrating waveform transactions. As shown, composite signal S contains 4 scalar signals. Each scalar signal has a driver and a corresponding waveform which takes on particular values at given times. The event queue includes four time slots corresponding to times of 5 nanoseconds (ns), 6 ns, 7 ns, and 9 ns. A time slot in the event queue includes all transactions that have a time value which is the same as the time value of the time slot. The transactions, for example, can be maintained in a list.

In illustration, FIG. 1 illustrates the current state of the composite waveform S and the event queue at the current time, or "now" time, of 5 ns. The following signal assignment statement can be executed: "S<=reject 3 ns inertial "10UX" after 5 ns". This signal assignment statement will create four new transactions which will be appended to the scalar waveforms and the event queue.

Figure 2:
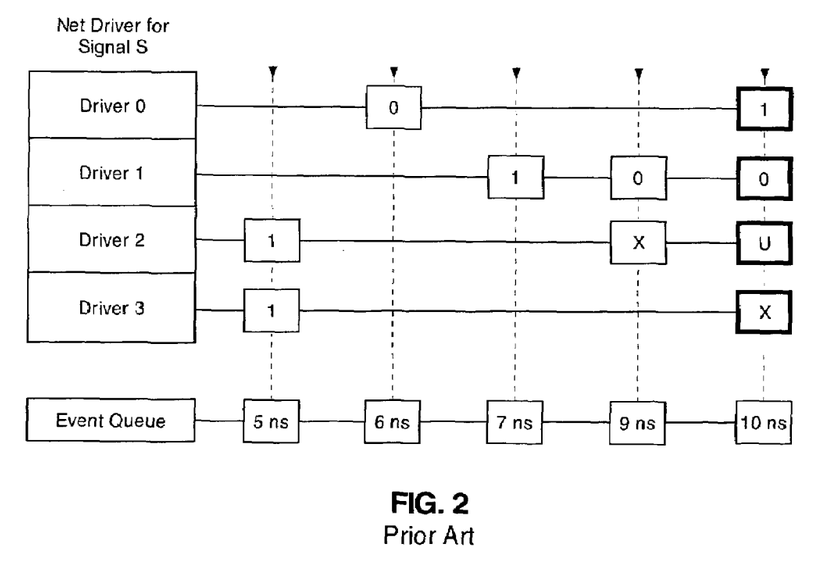
FIG. 2 is a schematic diagram illustrating a conventional manner of depicting the state of signal S after execution of a signal assignment statement.

FIG. 2 is a schematic diagram that illustrates the state of signal S after execution of the signal assignment statement. The transactions in each waveform are in increasing order with respect to time.

In performing inertial rejection, any previously scheduled transaction which is scheduled to occur at or after the time of the new transaction is deleted. No such transactions exist within FIG. 2. All transactions in the rejection window, which can be calculated as (the time of the new transaction)–(time of the rejection), can be examined for possible rejection. In this case, the equation becomes 10 ns–3 ns=7 ns.

Figure 3:
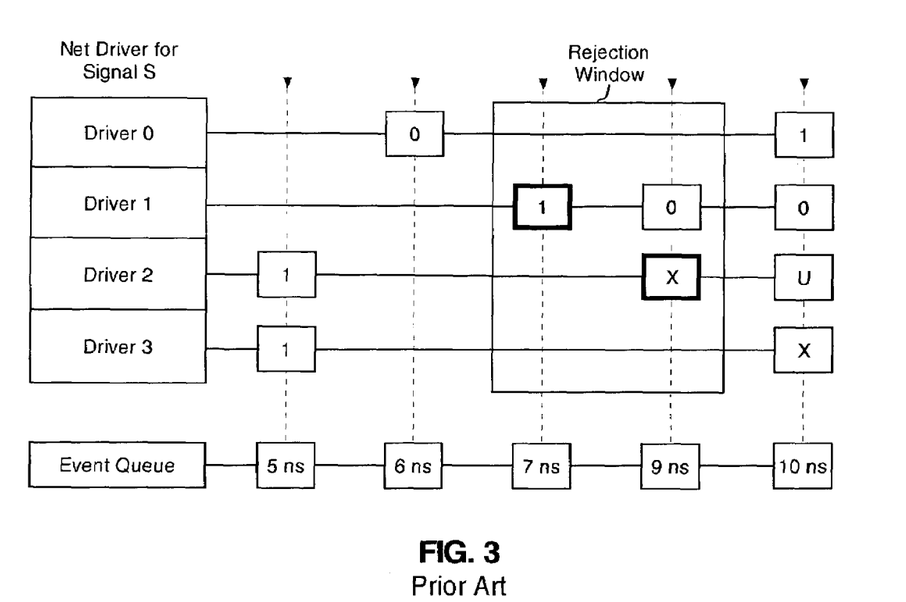
FIG. 3 is a schematic diagram illustrating those transactions which are marked as unscheduled after performance of inertial rejection.

Continuing with FIG. 3, the transactions within the rejection window, i.e., those transactions occurring at 7 and 9 ns can be analyzed. In particular, transactions occurring in the rejection window, with the exception of transactions occurring at the current time, should that timeslot fall within the rejection window, or transactions which have a value which is the same as the newly added transaction can be deleted or marked unscheduled. Accordingly, the transactions which have been marked unscheduled, i.e., the transaction having a value of 1 for driver 1 at 7 ns and the transaction having a value of X for driver 2 at 9 ns, have been indicated with bolded perimeters.

Since each scalar signal contained in a composite signal must keep that scalar signal's own waveform, a transaction to a composite signal with N scalar signals needs to add N transactions in order to project the waveform of the scalar drivers. In addition, N transactions must be scheduled and processed on the event queue. If the scalar drivers are aggregated, the scheduling and processing of transactions have a complexity on the order of N because individual projected waveforms of scalar signals must be preserved for the inertial rejection technique to function properly.

In consequence, the amount of time required to perform inertial rejection using software simulation tools can be significant as the sheer number of calculations necessary can be quite extensive. What is needed is an improved technique for modeling transactions that reduces the time required for scheduling and transaction processing; as well as an improved technique for performing inertial rejection that utilizes fewer processing resources, less simulation time, and therefore reduces the time required for design and implementation.

SUMMARY OF THE INVENTION

Exemplary embodiments in accordance with the present invention provide a method, system, and apparatus for modeling transactions and performing inertial rejection processing. More particularly, such embodiments realize significant performance benefits with respect to transaction modeling, scheduling, and processing in the context of software logic simulation. Such embodiments disclose a technique of aggregating one or more transactions into an atomic transaction and teaches an alternative to presently available techniques for performing inertial rejection.

According to the present invention, scalar drivers can be aggregated and transactions that occur at the same time can be aggregated into a single "atomic" transaction object. Inertial rejection, however, can be applied to the resulting atomic transaction objects on a per scalar signal basis. Additionally, when necessary, transaction objects can be split to maintain atomicity, that is the sequential nature of non-null value scalar signals. Accordingly, the various parameters of the atomic transactions can be manipulated rather than processing a larger number of conventional transactions. Additionally, an exemplary embodiment in accordance with the present invention, when possible, can perform preemptive processing to attain further gains in performance.

One aspect of the present invention can include a method of performing inertial rejection, for example, within a software-based logic simulation tool. The method can include representing a plurality of scalar signals as one or more transaction objects, wherein each transaction object includes a start index, an end index, values for each constituent scalar signal which correspond to an index within a range specified by the start index and end index inclusive, and a time at which the values are transacted. The method further can include constructing and adding a new transaction object for the plurality of scalar signals and comparing the new transaction object with at least one existing transaction object, wherein the at least one existing transaction object occurs earlier in time than the new transaction object and is within a rejection window. Accordingly, at least one of the start indices and the end indices of the at least one existing transaction objects can be manipulated to perform inertial rejection. Notably, one or more values of the existing transaction objects also can be manipulated.

More particularly, the method can include comparing values for scalar signals of the new transaction object with values of scalar signals of the at least one existing transaction object, wherein only values for scalar signals having like indices are compared. If the value of the scalar signal in the at least one existing transaction object differs from the value of the scalar signal of like index in the new transaction object, the value in the at least one existing transaction object can be changed to a null value. That is, the at least one existing transaction object can be assigned no value indicating that for those indices, no new transactions are being scheduled. If the value of the scalar signal in the at least one existing transaction object is the same as the value of the scalar signal of like index in the new transaction object, the value of the existing transaction object can be left unchanged. If at least one of the values of the scalar signal of the at least one existing transaction object, the new transaction object, or both, is a null value, both values can remain unchanged. The various operations can be repeated for each scalar signal of the new transaction object having a non-null value.

Accordingly, the start index and the end index of the at least one existing transaction object can be modified according to the values of the scalar signals remaining in the at least one existing transaction object. Notably, if the at least one existing transaction object includes values for scalar signals which do not have corresponding sequential indices, the at least one existing transaction object can be split into at least two transaction objects such that each newly formed transaction object includes one or more values for scalar signals having sequential indices.

The method also can include, prior to constructing and adding the new transaction object, determining that the plurality of scalar signals do not qualify for preemptive processing. Additionally, if desired, at least two of the existing transaction objects, or transactions as the case may be, can be combined if each occurs at a same time and if, when combined, the values of the scalar signals correspond to sequential scalar indices.

Another embodiment of the present invention can include a method of processing signals within a software-based logic simulation tool wherein a plurality of scalar signals are represented as one or more transaction objects. Each transaction object can represent at least one transaction, wherein each transaction object includes a start index, an end index, values for each scalar signal which correspond to an index within a range specified by the start index and end index inclusive, and a time at which the values are transacted. The method also can include determining whether each scalar signal qualifies for preemptive processing and, for each scalar signal so qualified, determining whether a new transaction being scheduled has a value which is the same as the current value of the scalar signal to which the transaction is being added. If so, the new transaction need not be added and all previously existing transactions can be removed from each scalar signal having a same value.

Another embodiment of the present invention can include a system for performing inertial rejection. The system can include means for representing a plurality of scalar signals as one or more transaction objects, wherein each transaction object includes a start index, an end index, values for each constituent scalar signal which correspond to an index within a range specified by the start index and end index inclusive, and a time at which the values are transacted. The system further can include means for constructing and adding a new transaction object for the plurality of scalar signals and means for comparing the new transaction object with at least one existing transaction object, wherein the at least one existing transaction object occurs earlier in time than the new transaction object and is within a rejection window. The system also can include means for manipulating at least one of the start indices and the end indices of the at least one existing transaction objects.

Yet another embodiment of the present invention can include a system for performing inertial rejection including means for representing a plurality of scalar signals as one or more transaction objects, wherein each transaction object represents at least one transaction, and wherein each transaction object includes a start index, an end index, values for each scalar signal which correspond to an index within a range specified by the start index and end index inclusive, and a time at which the values are transacted. This embodiment of the present invention also can include means for determining whether each scalar signal qualifies for preemptive processing and, for each scalar signal so qualified, means for determining whether a new transaction being scheduled has a value which is the same as the current value of the scalar signal to which the transaction is being added. If so, the system further can include means for not adding the new transaction and removing all previously existing transactions from each scalar signal having a same value.

BRIEF DESCRIPTION OF THE DRAWINGS

There are shown in the drawings embodiments which are presently preferred, it being understood, however, that the invention is not so limited to the precise arrangements and instrumentalities shown.

DETAILED DESCRIPTION OF THE INVENTION

Embodiments in accordance with the present invention provide a method, system, and apparatus for modeling transactions and performing inertial rejection processing. According to such embodiments, scalar signals and transactions occurring at a given time can be represented by a single "atomic" transaction object. By using atomic transaction objects as a simulation construct, the number of transactions which must be processed is reduced. This also reduces the order of complexity of the calculations that are to be performed for inertial rejection.

Figure 4:
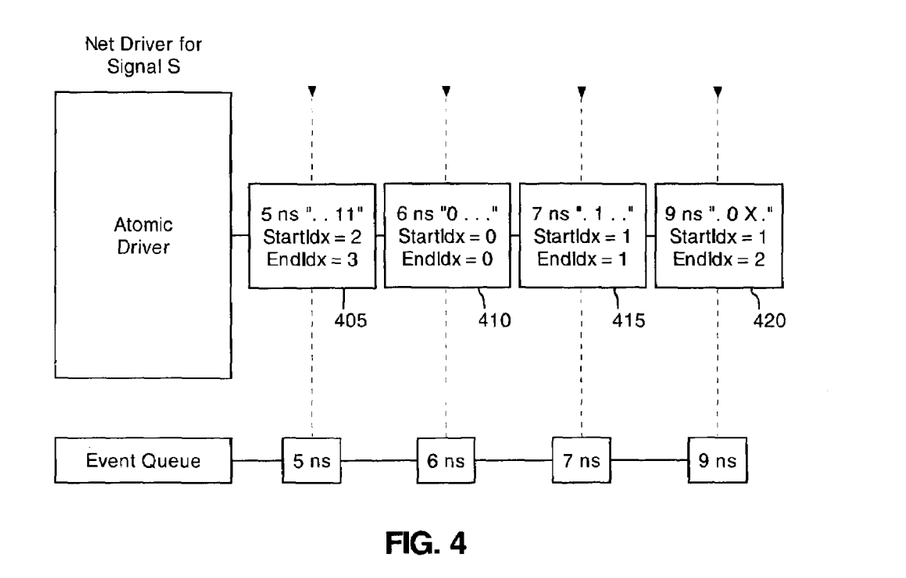
FIG. 4 is a schematic diagram illustrating the manner in which a composite signal can be represented as one or more atomic transactions in accordance with the present invention.

FIG. 4 is a schematic diagram illustrating the manner in which a whole signal can be represented as one or more atomic transactions. An atomic transaction object, as used herein, can represent the whole signal irrespective of whether the signal is a scalar or composite type. Atomic transaction objects can include four components: one or more values, a time at which the value or values are to be transacted, a start index, and an end index. All scalar values contained in a signal are assigned a scalar index. In illustration, if there are N scalar signals contained in a target composite signal, the first scalar signal can be assigned scalar index 0. Subsequent scalar signals can be assigned sequentially increasing scalar indices such that the last scalar signal can be assigned a scalar index of N-1.

The value component of the atomic transaction object is a pointer to a memory location where values for individual scalar signals can be stored in contiguous memory locations in the order in which the scalar signals are contained inside of the whole signal. If the whole signal is a scalar signal, then there is only one scalar signal contained inside the whole signal. Accordingly, the value of N would be equal to 1.

The start scalar index and the end scalar index of an atomic transaction object can be set according to the signal assignment statement. If the whole signal is being driven, the start scalar index can be set to 0 and the end scalar index can be set to N-1. If a range of scalar signals is driven, the start scalar index can be set to the starting index of the range and the end scalar index can be set to the ending scalar index of the range. If only one scalar signal out of multiple scalar signals contained in a whole signal is driven, the start scalar index and the end scalar index both are set to be the scalar index of the driven scalar signal.

Accordingly, as shown in FIG. 4, the various individual transactions originally discussed with reference to FIG. 1, have been aggregated into four atomic transaction objects 405, 410, 415, and 420. Atomic transaction object 405 represents each transaction for the combined scalar signals that occurs at the 5 ns timeslot in the event queue. Atomic transaction object 410 represents each transaction that occurs at event queue timeslot 6 ns, atomic transaction object 415 represents those transactions for event queue timeslot 7 ns, and atomic transaction object 420 represents those transactions for event queue timeslot 9 ns.

Thus, atomic transaction object 405 represents only two transactions, the first occurring at 5 ns for the scalar signal having an index corresponding to 2, and the second also occurring at 5 ns for the scalar signal corresponding to the index of 3. Within FIG. 4 and throughout FIGS. 5–8, start scalar index is represented by "StartIdx" and end scalar index is represented by "EndIdx". Accordingly, the text "5 ns ' . . . 11'" indicates that the scalar signals having a scalar index of 0 and 1 have null values or no value at 5 ns. The scalar signals having a scalar index of 2 and 3 have values of 1 and 1 respectively. As such, the start scalar index for atomic transaction object 405 is set to 2 and the end scalar index is set to 3.

For every whole signal, whether scalar or composite, rather than having a driver for each scalar signal, a single driver for the whole signal can be created. Atomic transaction objects for the whole signal can be added as a projected waveform. As new atomic transaction objects are added, inertial rejection can be performed.

Notably, the execution of a signal assignment statement can initiate a check to determine whether preemptive processing can be performed. Preemptive processing can be applied in particular circumstances which involve a zero delay signal assignment statement. Preemptive processing further relates to cases in which a new transaction can be dropped or ignored and the existing scalar signal can be completely truncated. For example, at the time of elaboration of a design, prior to applying the atomic transaction object construct, all whole signals can be checked to determine whether preemptive processing can be applied. The target signal and all the signals connected to the target signal (if any) can be checked to determine whether that signal is a prefix of a predefined attribute which requires activity of the signal to be recorded.

If no such use of the whole signal is detected, the signal can be marked as qualified for preemptive processing. For a qualified whole signal, if the new transaction being scheduled has the same value for a particular scalar signal within the whole signal as the current value of the same scalar signal, all previously existing transactions (if any) can be removed from the projected waveform of the scalar signal. Additionally, the new transaction is not added to the scalar signal. Accordingly, by not scheduling such transactions, preemptive processing can save time and processing resources that would otherwise be expended when adding and updating a waveform or adding a new transaction to the event queue, each of which translates into reduced cost for processing the transaction.

If preemptive processing cannot be performed with respect to the whole signal, an atomic transaction object can be constructed and added to the projected waveform contained in the driver of the whole signal. Inertial rejection then can be performed in accordance with the inventive arrangements disclosed herein.

Figure 5:
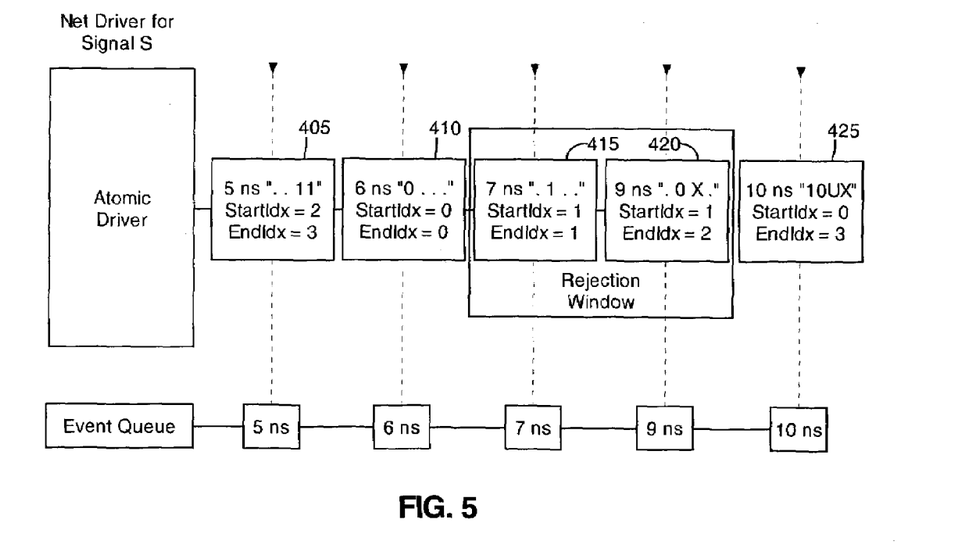
FIG. 5 is a schematic diagram illustrating a processing state occurring after the execution of a signal assignment statement in accordance with the present invention.

FIG. 5 is a schematic diagram illustrating a processing state occurring after the execution of the signal assignment statement "S<=reject 3 ns inertial "10ux" after 5 ns". The signal assignment statement has caused the addition of the atomic transaction object 425. The atomic transaction object 425 specifies that at a time corresponding to 10 ns in the event queue, the various scalar signals corresponding to indices 0–4 have values of 1, 0, U, and X respectively.

Figure 6:
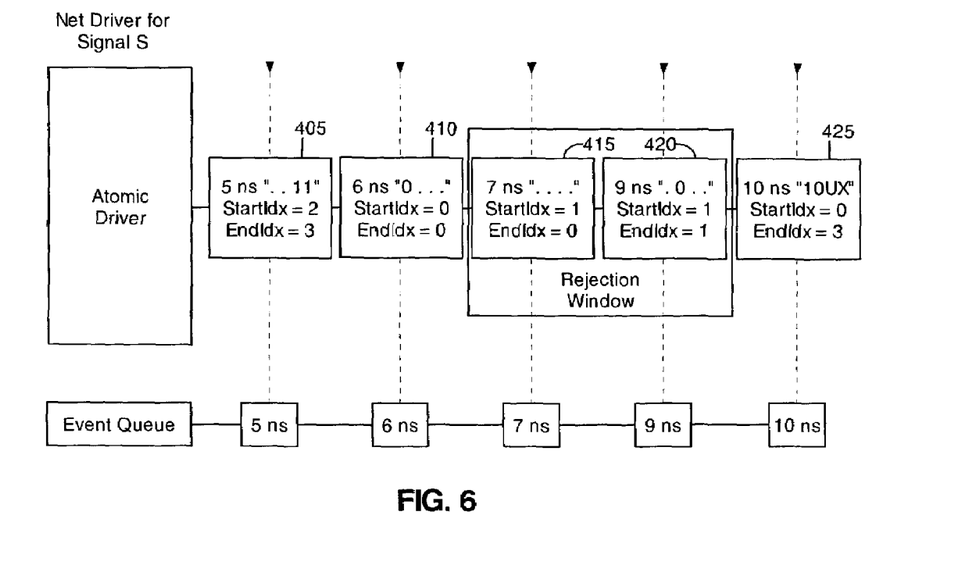
FIG. 6 is a schematic diagram illustrating a processing state occurring after the application of inertial rejection in accordance with the present invention.

FIG. 6 is a schematic diagram illustrating a processing state occurring after the application of inertial rejection. As shown, the atomic transaction objects 415 and 420, each located within the rejection window, have been altered from their original states shown in FIGS. 4 and 5. In particular, the values of the scalar signals represented by each atomic transaction object have been altered as well as the start and end scalar indices which now reflect only the scalar signals which have actual or "non-null" values.

For example, atomic transaction object 415 has a start scalar index of 1 and an end scalar index of 0, indicating that all values corresponding to the scalar signals are null. Atomic transaction object 415 of FIG. 6 reflects the condition wherein after the application of inertial rejection, an atomic transaction object can have an end scalar index which is less than the start scalar index. A similar condition can occur in case where an atomic transaction object is to be split, a process that will be described in greater detail herein. In any event, such atomic transaction objects are void and can be removed from the waveform and marked as unscheduled in the event queue.

Atomic transaction object 420 has a start scalar index of 1 and an end scalar index of 1 indicating that all of the scalar signals represented in transaction object 420, with the exception of the scalar signal having scalar index 1, have null values. The values can be modified by comparing values of like scalar signals from one atomic transaction object to the next. For example, the scalar signal corresponding to scalar index 0 in atomic transaction object 425 can be compared to the scalar signal corresponding to scalar index 0 within atomic transaction 420. Because the value corresponding to scalar index 0 in atomic transaction 420 is a null value, no change is made. The value of the scalar signal corresponding to scalar index 1 within atomic transaction 420 is the same as its counterpart within atomic transaction object 425, and accordingly is not changed. The value of the scalar signal corresponding to scalar index 2 is changed to a null as the value in atomic transaction 420 differs from its counterpart in atomic transaction object 425. The value of the scalar signal corresponding to scalar index 3 in atomic transaction object 420 remains unchanged as a null value as a result of the comparison with its counterpart scalar signal value in atomic transaction 425. Notably, only the atomic transactions within the rejection window, in this case atomic transaction objects 415 and 420, need be compared with the newly added atomic transaction object 425.

As illustrated, no splitting was required with respect to the examples described in FIGS. 5 and 6. Inertial rejection was performed by adjusting the scalar indices only. The atomic transaction object 415 has scalar signal of scalar index 1 rejected and atomic transaction object 420 has scalar signal of scalar index 2 rejected. Atomic transaction object 415 is left with no valid scalar index and, therefore, is a void transaction.

Figure 7:
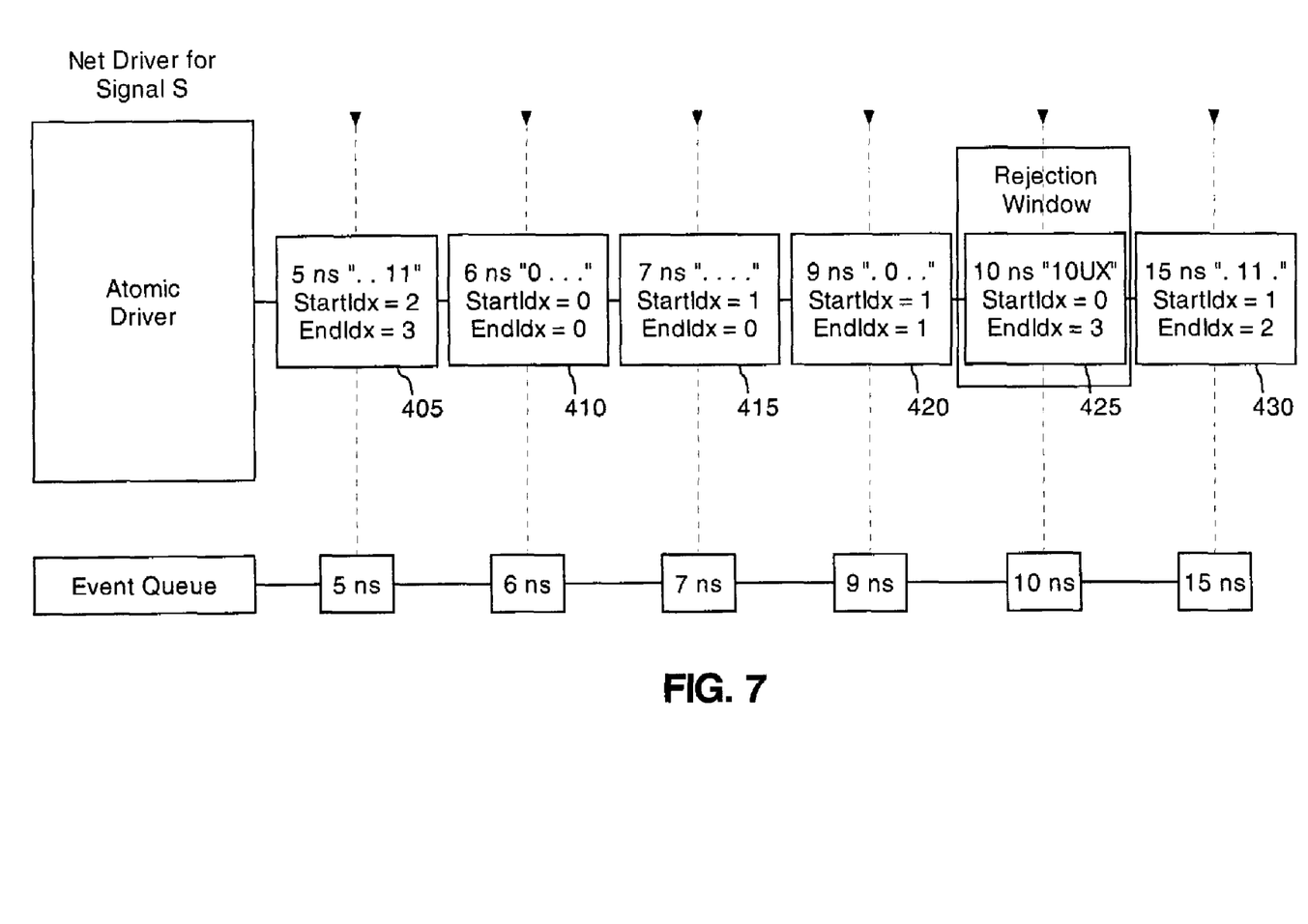
FIG. 7 is a schematic diagram illustrating a processing state occurring after the execution of a second signal assignment statement in accordance with the present invention.

FIG. 7 is a schematic diagram illustrating a processing state occurring after the execution of the signal assignment statement "S(1 to 2)<=reject 5 ns inertial "11" after 10 ns". The signal assignment statement has caused the addition of the atomic transaction object 430 to the waveform. The atomic transaction object 430 specifies that at a time corresponding to 15 ns in the event queue, the various scalar signals corresponding to indices 0–4 have values of null, 1, 1, and null respectively.

To perform inertial rejection, the values of the scalar signals for the atomic transaction object 425 can be determined by comparing the values of scalar signals having the same scalar index from one atomic transaction object to the next. For example, the scalar signal corresponding to scalar index 0 in atomic transaction object 430 can be compared to the scalar signal corresponding to scalar index 0 within atomic transaction 425. Because this value in atomic transaction 430 is a null value, no change is made. The value of the scalar signal corresponding to scalar index 1 within atomic transaction 430 is an actual value (not a null value) and is different from its counterpart within atomic transaction object 425, which also is an actual value. Accordingly, the value of the scalar signal corresponding to scalar index 1 in atomic transaction object 425 is changed to a null value. The value of the scalar signal corresponding to scalar index 2, which is an actual value, is also changed to a null value as the corresponding value in atomic transaction 430, which also is an actual value, differs from its counterpart in atomic transaction object 425. The value of the scalar signal corresponding to scalar index 3 in atomic transaction object 425 remains unchanged because the value of its counterpart scalar signal in atomic transaction 430 is a null value.

Thus, the signal assignment statement S(1 to 2)<=reject 5 ns inertial "11" after 10 ns" indicates that only bit 1 and 2 of signal S are driven. Performing inertial rejection on individual scalar bits, the atomic transaction at 10 ns should have scalar index 1 and scalar index 2 rejected, leaving two transactions represented within atomic transaction 425 at 10 ns, one transaction with a range of 0 to 0 and the other with a range of 3 to 3.

The resulting atomic transaction object 425 includes values for scalar signals corresponding to scalar indices 0 and 3. As the atomic transaction object 425 does not have values for all scalar indices between 0 and 3 sequentially, the atomic transaction object 425 becomes a candidate for splitting into one or more atomic transaction objects. Notably, just as atomic transaction objects can be split, transactions and/or atomic transaction objects can also be joined. For example, a check can be performed with respect to combining split transactions in a waveform. More particularly, if the time component of two transactions in the same waveform is the same and if the two transactions can be combined such that no hole or gap would result with respect to the values of the scalar indices, then the two transactions can be combined.

Figure 8:
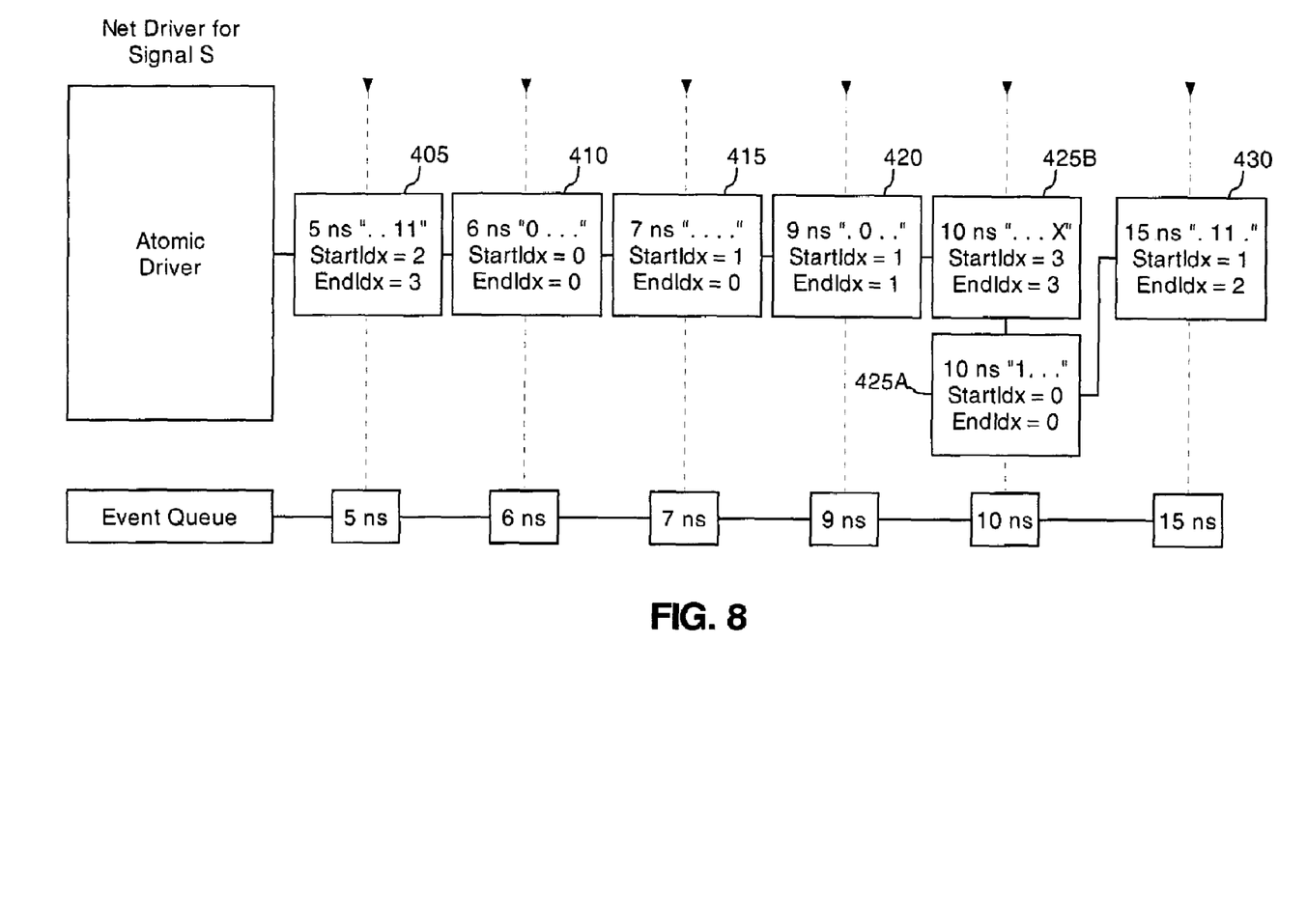
FIG. 8 is a schematic diagram illustrating a processing state occurring after the application of inertial rejection wherein the atomic transaction object has been split into two atomic transaction objects in accordance with one aspect of the present invention.

FIG. 8 is a schematic diagram illustrating a processing state occurring after the application of inertial rejection wherein the atomic transaction object 425 has been split into two atomic transaction objects, particularly atomic transaction object 425A and 425B. As shown, atomic transaction object 425B has a start scalar index of 3 and an end scalar index of 3, indicating that all values corresponding to the scalar signals are null except for the scalar signal corresponding to scalar index 3. Atomic transaction object 425A has a start scalar index of 0 and an end scalar index of 0 indicating that the all of the scalar signals, with the exception of the scalar signal corresponding to scalar index 0, have null values.

Inertial rejection must be performed for each scalar signal independently as assignments may be applied to one particular scalar index from a bundle contained within a whole signal. FIG. 8 illustrates the case where an atomic transaction object has start scalar index set to SI, in this case 0, and end scalar index set to EI, in this case 3. Values for indices from a rejection start scalar index (RSI) of 1 to a rejection end scalar index (REI) of 2 are deleted during performance of inertial rejection such that RSI>=SI and REI<=EI. As was demonstrated with reference to FIGS. 7 and 8, this can create a hole or gap in the scheduled atomic transaction object.

Since an atomic transaction object can only contain a range for indices from start scalar index to end scalar index, such a transaction must be broken into one or more transactions, two in this case. The first atomic transaction object, following the waveform from right to left, has indices from SI to RSI−1 and the second atomic transaction object has indices from REI+1 to EI. Thus, with reference to FIG. 8, the first atomic transaction object corresponding to atomic transaction object 425A has indices from 0 to 0 and the second atomic transaction object corresponding to atomic transaction object 425B has indices from 3 to 3.

Figure 9:
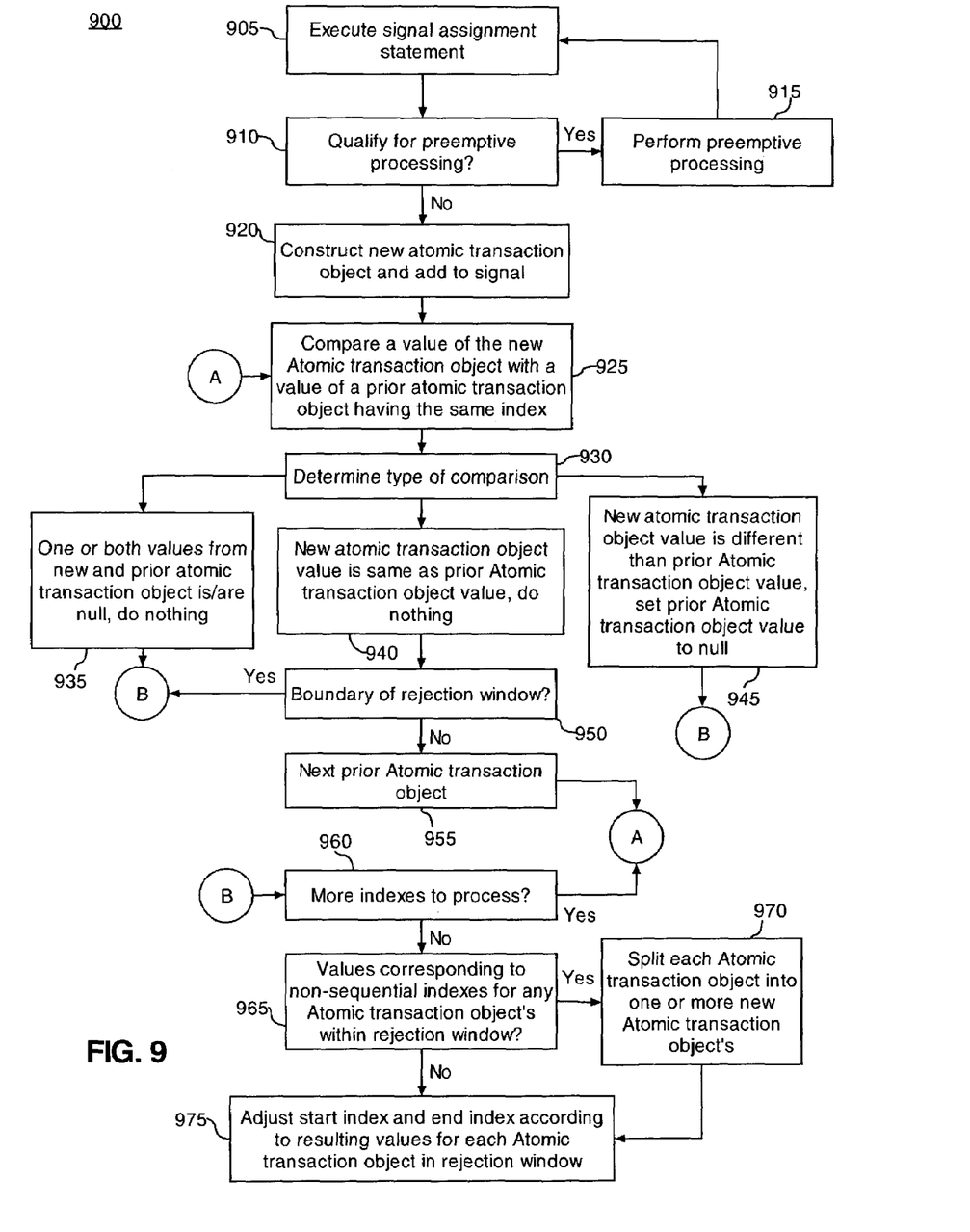
FIG. 9 is a flow chart illustrating a method of performing inertial rejection in accordance with the inventive arrangements disclosed herein.

FIG. 9 is a flow chart illustrating a method 900 of performing inertial rejection in accordance with the inventive arrangements disclosed herein. The method 900 can begin in a state wherein a particular logic design is being simulated within a software-based simulation tool. Accordingly, beginning in step 905, a signal assignment statement can be executed. In step 910, a determination can be made as to whether the whole signal qualifies for preemptive processing. If so, the method can proceed to step 915, where preemptive processing can be performed and the method can continue to step 905 to repeat as necessary. If the whole signal does not qualify for preemptive processing, the method can continue to step 920.

In step 920, a new atomic transaction object can be constructed and added to the whole signal. In step 925, the values of the scalar signals within the new atomic transaction object can be compared to the values of the scalar signals within prior atomic transaction objects. That is, the method can begin a loop wherein values of scalar signals from atomic transaction objects within the rejection window can be compared with values of scalar signals of the new atomic transaction object. Notably, only values of scalar signals having like or same indices are compared.

Accordingly, in step 930, a determination can be made regarding the type of comparison to be performed. As noted, only scalar signals of like scalar indices are to be compared. For example, if either value—or both—to be compared from the new or the prior atomic transaction object is a null, the method can proceed to step 935. If the values from both the new and prior atomic transaction objects of the same scalar index are actual values and are the same, the method can proceed to step 940. If the value from the new atomic transaction object is different from the value of the prior atomic transaction of the same scalar index, and both are actual values, the method can proceed to step 945.

Proceeding with step 935, where the value in the new atomic transaction object, the value in the prior or existing transaction object, or both include null values, the values can remain unchanged. In this case, there is no need to continue looking back for prior atomic transaction objects when a null value is encountered. Accordingly, the method can proceed to step 960 to determine whether more indices remain to be processed.

If the method proceeds to step 940, in the case where the value from the new atomic transaction object is the same as the value from the prior atomic transaction object, and both are actual values, the values again can remain unchanged. In this case, however, the method can proceed to step 950 where a determination can be made as to whether the boundary of the rejection window has been reached. That is, there is no need to evaluate atomic transaction objects that are outside of the rejection window. Accordingly, if the boundary of the rejection window has not been reached, the method can proceed to step 955 where the next prior atomic transaction object can be identified. The method can proceed to jump circle A, to loop back to step 925 to continue checking values for the scalar signal of the next prior atomic transaction object for the same index that was processed in step 940.

If the method proceeds to step 945 in the case where the values being compared are different and are both actual values, the value of the prior atomic transaction object can be set to a null value. Accordingly, the method can proceed to step 960 to continue processing scalar signals for a next scalar index.

Thus, the method can continue looping through steps 925–960 until no further indices are left to process for atomic transactions within the rejection window. Accordingly, the method can proceed to step 965, where a determination can be made as to whether any of the atomic transaction objects within the rejection window now have, as a result of inertial rejection processing, values for scalar signals which correspond to non-sequential scalar indices. As noted, such atomic transaction objects are candidates for splitting. If one or more such candidates are identified, the method can proceed to step 970, where the identified atomic transaction objects can be split into one or more new atomic transaction objects so that each resulting atomic transaction object has values for scalar signals corresponding to sequential scalar indices.

The method can proceed to step 975 from both steps 965 and 970. In step 975, the start and end scalar index for any affected atomic transaction objects within the rejection window can be adjusted according to the resulting values for scalar signals within the atomic transaction objects. As noted, if after the application of inertial rejection one or more atomic transaction objects have an end scalar index that is less than the start scalar index, such atomic transaction objects can be considered void and can be removed from the waveform and marked as unscheduled in the event queue.

Although the flow chart 900 has been described with reference to adding a single atomic transaction object, those skilled in the art will recognize that the method described herein can be applied iteratively for processing large logic designs. Further, the method 900 can be applied readily to both scalar and composite signals.

According to exemplary embodiments in accordance with the present invention, all previously scheduled atomic transaction objects in the rejection window are potentially examined for one or more scalar bits to be rejected. Start and end scalar indices can be changed to effect rejection of a particular bit. If rejection of bits creates a hole or gap as previously explained, the atomic transaction object upon which inertial rejection is being performed can be split into two or more atomic transaction objects.

An embodiment of the present invention can be realized in hardware, software, or a combination of hardware and software. The embodiment can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

An embodiment of the present invention also can be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. A method of simulating a circuit design within a logic simulation tool using inertial rejection comprising:
    representing a plurality of scalar signals over time as a series of transaction objects, wherein each transaction object comprises a start index, an end index, a value for each of the plurality of scalar signals, and a single time at which the value of each of the plurality of scalar signals is transacted within the logic simulation tool, wherein each scalar signal of a transaction object is associated with an index within a range specified by the start index and the end index of that transaction object, and wherein the start index and end index of each transaction object indicate non-null values for the plurality of scalar signals within each transaction object;
    constructing and adding a new transaction object for the plurality of scalar signals;
    comparing values of the plurality of scalar signals of the new transaction object with values of the plurality of scalar signals for at least one existing transaction object, wherein the at least one existing transaction object occurs earlier in time than the new transaction object and is within a rejection window;
    modifying at least one of the scalar signals of the circuit design by manipulating at least one of the start indices or the end indices of the at least one existing transaction object; and
    performing functional simulation or timing simulation upon the circuit design by processing signals specified by the transaction objects.

2. The method of claim 1, said step of modifying further comprising:
    manipulating at least one of the values of the existing transaction objects.

3. The method of claim 1, said comparing step further comprising:
    comparing values for scalar signals of the new transaction object with values of scalar signals of the at least one existing transaction object, wherein only values for scalar signals having like indices are compared.

4. The method of claim 3, said modifying step further comprising:
    if the value of the scalar signal in the at least one existing transaction object differs from the value of the scalar signal of like index in the new transaction object, changing the value in the at least one existing transaction object to a null value;
    if the value of the scalar signal in the at least one existing transaction object is the same as the value of the scalar signal of like index in the new transaction object, leaving the value of the at least one existing transaction object unchanged; and
    if at least one of the values of the scalar signal of the at least one existing transaction object, the new transaction object, or both is a null value, leaving both values unchanged.

5. The method of claim 4, wherein the steps of claim 4 are repeated for each scalar signal of the new transaction object having a non-null value.

6. The method of claim 5, said modifying step further comprising:
    modifying the start index and the end index of the at least one existing transaction object according to the values of the scalar signals remaining in the at least one existing transaction object.

7. The method of claim 6, said modifying step further comprising:
    if the at least one existing transaction object includes values for scalar signals which do not have corresponding sequential indices, splitting the at least one existing transaction into at least two transaction objects such that each newly formed transaction object includes one or more values for scalar signals having sequential indices.

8. The method of claim 1, further comprising:
    prior to said step of constructing and adding a new transaction object, determining that the plurality of scalar signals do not qualify for preemptive processing.

9. The method of claim 1, further comprising:
    combining at least two of the existing transaction objects if each occurs at a same time and if, when combined, the values of the scalar signals correspond to sequential scalar indices.

10. The method of claim 1, further comprising:
    combining at least two transactions if each occurs at a same time and if, when combined, the values of the scalar signals correspond to sequential scalar indices.

11. The method of claim 1, wherein a transaction object having an end index which is less than the start index indicates a void transaction.

12. A method of simulating a circuit design within a software-based logic simulation tool using inertial rejection comprising:
    representing a plurality of scalar signals as one or more transaction objects, wherein each transaction object represents at least one transaction, and wherein each transaction object comprises a start index, an end index, a value for each of the plurality of scalar signals wherein each scalar signal corresponds to an index within a range specified by the start index and end index inclusive, and a single time at which the value of each of the plurality of scalar signals is transacted within a logic simulation tool, and wherein the start index and end index of each transaction object indicate non-null values for the plurality of scalar signals within each transaction object;
    determining whether each scalar signal qualifies for preemptive processing;
    for each scalar signal so qualified, determining whether a new transaction being scheduled has a value which is the same as the current value of the scalar signal to which the transaction is being added;

if so, not adding the new transaction and removing all previously existing transactions from each scalar signal having a same value by modifying at least one of the start index or the end index for the transaction objects corresponding to the transactions being removed; and performing functional simulation or timing simulation upon the circuit design by processing signals specified by the transaction objects.

13. A machine readable storage, having stored thereon a computer program having a plurality of code sections executable by a machine for causing the machine to perform the steps of:

representing a plurality of scalar signals over time as a series of transaction objects, wherein each transaction object comprises a start index, an end index, a value for each of the plurality of scalar signals, and a single time at which the value of each of the plurality of scalar signals is transacted within a logic simulation tool, wherein each scalar signal of a transaction object is associated with an index within a range specified by the start index and the end index of that transaction object, and wherein the start index and end index of each transaction object indicate non-null values for the plurality of scalar signals within each transaction object;

constructing and adding a new transaction object for the plurality of scalar signals;

comparing the new transaction object with at least one existing transaction object, wherein the at least one existing transaction object occurs earlier in time than the new transaction object and is within a rejection window;

modifying at least one of the scalar signals of the circuit design by manipulating at least one of the start indices or the end indices of the at least one existing transaction objects; and performing functional simulation or timing simulation upon the circuit design by processing signals specified by the transaction objects.

14. The machine readable storage of claim 13, said step of modifying further comprising:

manipulating at least one of the values of the existing transaction objects.

15. The machine readable storage of claim 13, said comparing step further comprising:

comparing values for scalar signals of the new transaction object with values of scalar signals of the at least one existing transaction object, wherein only values for scalar signals having like indices are compared.

16. The machine readable storage of claim 15, said modifying step further comprising:

if the value of the scalar signal in the at least one existing transaction object differs from the value of the scalar signal of like index in the new transaction object, changing the value in the at least one existing transaction object to a null value;

if the value of the scalar signal in the at least one existing transaction object is the same as the value of the scalar signal of like index in the new transaction object, leaving the value of the at least one existing transaction object unchanged; and if at least one of the values of the scalar signal of the at least one existing transaction object, the new transaction object, or both is a null value, leaving both values unchanged.

17. The machine readable storage of claim 16, wherein the steps of claim 16 are repeated for each scalar signal of the new transaction object having a non-null value.

18. The machine readable storage of claim 17, said modifying step further comprising:

modifying the start index and the end index of the at least one existing transaction object according to the values of the scalar signals remaining in the at least one existing transaction object.

19. The machine readable storage of claim 18, said modifying step further comprising:

if the at least one existing transaction object includes values for scalar signals which do not have corresponding sequential indices, splitting the at least one existing transaction into at least two transaction objects such that each newly formed transaction object includes one or more values for scalar signals having sequential indices.

20. The machine readable storage of claim 13, wherein said steps are performed within a software-based logic simulation tool.

21. The machine readable storage of claim 13, further comprising:

prior to said step of constructing and adding a new transaction object, determining that the plurality of scalar signals do not qualify for preemptive processing.

22. The machine readable storage of claim 13, further comprising:

combining at least two of the existing transaction objects if each occurs at a same time and if, when combined, the values of the scalar signals correspond to sequential scalar indices.

23. The machine readable storage of claim 13, further comprising:

combining at least two transactions if each occurs at a same time and if, when combined, the values of the scalar signals correspond to sequential scalar indices.

24. A machine readable storage, having stored thereon a computer program having a plurality of code sections executable by a machine for causing the machine to perform the steps of:

representing a plurality of scalar signals as one or more transaction objects, wherein each transaction object represents at least one transaction, and wherein each transaction object comprises a start index, an end index, a value for each of the plurality of scalar signals wherein each scalar signal corresponds to an index within a range specified by the start index and end index inclusive, and a single time at which the value of each of the plurality of scalar signals is transacted within a logic simulation tool, and wherein the start index and end index of each transaction object indicate non-null values for the plurality of scalar signals within each transaction object;

determining whether each scalar signal qualifies for preemptive processing;

for each scalar signal so qualified, determining whether a new transaction being scheduled has a value which is the same as the current value of the scalar signal to which the transaction is being added;

if so, not adding the new transaction and removing all previously existing transactions from each scalar signal having a same value by modifying at least one of the start index or the end index for the transaction objects corresponding to the transactions being removed; and performing functional simulation or timing simulation upon the circuit design by processing signals specified by the transaction objects.

25. A system for simulating a circuit design within a logic simulation tool using inertial rejection comprising:

means for representing a plurality of scalar signals over time as a series of transaction objects, wherein each transaction object comprises a start index, an end index, a value for each of the plurality of scalar signals, and a single time at which the value of each of the plurality of scalar signals is transacted within the logic simulation tool, wherein each scalar signal of a transaction object is associated with an index within a range specified by the start index and the end index of that transaction object, and wherein the start index and end index of each transaction object indicate non-null values for the plurality of scalar signals within each transaction object;

means for constructing and adding a new transaction object for the plurality of scalar signals;

means for comparing the new transaction object with at least one existing transaction object, wherein the at least one existing transaction object occurs earlier in time than the new transaction object and is within a rejection window;

modifying at least one of the scalar signals of the circuit design by manipulating at least one of the start indices or the end indices of the at least one existing transaction object; and means for performing functional simulation or timing simulation upon the circuit design by processing signals specified by the transaction objects.

26. A system for simulating a circuit design using inertial rejection comprising:

means for representing a plurality of scalar signals as one or more transaction objects, wherein each transaction object represents at least one transaction, and wherein each transaction object comprises a start index, an end index, a value for each of the plurality of scalar signals wherein each scalar signal corresponds to an index within a range specified by the start index and end index inclusive, and a single time at which the value of each of the plurality of scalar signals is transacted within a logic simulation tool, and wherein the start index and end index of each transaction object indicate non-null values for the plurality of scalar signals within each transaction object;

means for determining whether each scalar signal qualifies for preemptive processing;

for each scalar signal so qualified, means for determining whether a new transaction being scheduled has a value which is the same as the current value of the scalar signal to which the transaction is being added;

if so, means for not adding the new transaction and removing all previously existing transactions from each scalar signal having a same value by modifying at least one of the start index or the end index for the transaction objects corresponding to the transactions being removed; and means for performing functional simulation or timing simulation upon the circuit design by processing signals specified by the transaction objects.

* * * * *